United States Patent
Yamamoto

(10) Patent No.: US 10,714,302 B2
(45) Date of Patent: Jul. 14, 2020

(54) ION BEAM IRRADIATION APPARATUS

(71) Applicant: Nissin Ion Equipment Co., Ltd., Koka (JP)

(72) Inventor: Tetsuro Yamamoto, Koka (JP)

(73) Assignee: NISSIN ION EQUIPMENT CO., LTD., Koka, Shiga (JP)

( * ) Notice: Subject to any disclaimer, the term of this patent is extended or adjusted under 35 U.S.C. 154(b) by 0 days.

(21) Appl. No.: 16/275,663

(22) Filed: Feb. 14, 2019

(65) Prior Publication Data
US 2019/0371563 A1    Dec. 5, 2019

(30) Foreign Application Priority Data
Jun. 1, 2018 (JP) ................................. 2018-105760
Nov. 21, 2018 (JP) ................................. 2018-218030

(51) Int. Cl.
*H01J 37/05* (2006.01)

(52) U.S. Cl.
CPC ......... *H01J 37/05* (2013.01); *H01J 2237/047* (2013.01); *H01J 2237/055* (2013.01); *H01J 2237/057* (2013.01); *H01J 2237/24564* (2013.01)

(58) Field of Classification Search
CPC ........ H01J 37/05; H01J 37/045; H01J 37/244; H01J 2237/047; H01J 2237/055; H01J 2237/057; H01J 2237/24535; H01J 2237/24564
See application file for complete search history.

(56) References Cited

U.S. PATENT DOCUMENTS

| | | | | |
|---|---|---|---|---|
| 6,525,327 B1* | 2/2003 | Mitchell | ............... | H01J 37/244 250/397 |
| 2003/0160190 A1* | 8/2003 | Kawaguchi | ......... | H01J 37/3171 250/492.21 |
| 2006/0076510 A1* | 4/2006 | Chang | ................. | H01J 37/3171 250/492.21 |
| 2006/0097195 A1* | 5/2006 | Angel | ....................... | G01T 1/29 250/492.21 |
| 2008/0078949 A1* | 4/2008 | Benveniste | ............. | H01J 37/05 250/492.21 |
| 2010/0237260 A1* | 9/2010 | Chen | ....................... | H01J 37/05 250/492.3 |
| 2011/0031388 A1* | 2/2011 | Bower | .................. | H01J 37/244 250/281 |

FOREIGN PATENT DOCUMENTS

| | | |
|---|---|---|
| JP | 11-126576 A | 5/1999 |
| JP | 2000-065942 A | 3/2000 |

* cited by examiner

*Primary Examiner* — David E Smith
(74) *Attorney, Agent, or Firm* — Sughrue Mion, PLLC

(57) ABSTRACT

An apparatus is provided. The apparatus includes a beam current measuring device and a first electrode. The beam current measuring device is retractably movable into an ion beam trajectory so as to measure an ion beam current. The first electrode is disposed immediately upstream of the beam current measuring device in an ion beam transport channel. The first electrode serves both as a suppressor electrode for repelling secondary electrons released from the beam current measuring device, back toward the beam current measuring device, and as a beam optical element other than the suppressor electrode.

19 Claims, 3 Drawing Sheets

ION BEAM IRRADIATION APPARATUS

CROSS-REFERENCE TO RELATED APPLICATION

This application claims priority from Japanese Patent Application No. JP2018-218030, filed Nov. 21, 2018 in the Japanese Patent Office and from Japanese Patent Application No. JP2018-105760, filed Jun. 1, 2018 in the Japanese Patent Office, the disclosures of each of which are incorporated by reference herein in their entireties.

BACKGROUND

1. Field

Exemplary embodiments relate to an apparatus equipped with a movable beam current measuring device and, more particularly, to an ion beam irradiation apparatus including the movable beam current measuring device.

2. Description of Related Art

Heretofore, a movable Faraday cup (also called a "beam current measuring device") as described in JP H11-126576A has been used in an ion beam irradiation apparatus. This Faraday cup is disposed downstream of a mass analyzing electromagnet in such a manner as to be retractably moved into a beam trajectory, and is used to measure a mass spectrum of a plurality of ion species contained in an ion beam subjected to mass analysis and adjust a magnetic field in the mass analyzing electromagnet, such that a beam current of a desired ion species is maximized.

A detailed structure of Faraday cup is described in JP 2000-065942A, in which the Faraday cup includes a cup body for measuring a beam current, and a suppressor electrode applied with a negative voltage for repelling secondary electrons released from the cup body, toward the cup body. The suppressor electrode makes it possible to achieve a beam measurement free of a measurement error due to the release of secondary electrons.

In the case where a suppressor electrode is incorporated in the movable Faraday cup, a drive mechanism for the movable Faraday cup must be provided and becomes complicated due to the routing of electric lines for supplying current to the suppressor electrode, and the weight of the suppressor electrode. Further, the suppressor electrode increases the cost of the ion beam irradiation apparatus. On the other hand, if the suppressor electrode is omitted, a measurement error will occur, due to absence of a means to repel secondary electrons released from a cup body of the movable Faraday cup, toward the cup body.

SUMMARY

It is an aspect to provide an ion beam irradiation apparatus capable of repelling secondary electrons released from a beam measuring part of a movable beam current measuring device, while simplifying a drive mechanism for the movable beam current measuring device.

According to an aspect of one or more embodiments, there is provided an apparatus comprising a beam current measuring device configured to be retractably moved into an ion beam trajectory so as to measure an ion beam current; and a first electrode disposed immediately upstream of the beam current measuring device in an ion beam transport channel, the first electrode being configured to serve both as a suppressor electrode for repelling secondary electrons released from the beam current measuring device, back toward the beam current measuring device, and as a beam optical element other than the suppressor electrode.

According to another aspect of one or more embodiments, there is provided an apparatus comprising a beam current measuring device configured to be retractably moved into an ion beam trajectory in an ion beam transport channel; and a first electrode fixedly disposed immediately upstream of the beam current measuring device in the ion beam transport channel, wherein, in a state in which the beam current measuring device in the ion beam trajectory, the first electrode repels secondary electrons released from the beam current measuring device, back toward the beam current measuring device, and in a state in which the beam current measuring device is not in the ion beam trajectory, the first electrode is a beam optical element.

According to yet another aspect of one or more embodiments, there is provided an ion beam irradiation apparatus for irradiating a target with an ion beam, the apparatus comprising an ion source; an extraction electrode system that extracts ions from the ion source; a mass analyzing electromagnet provided downstream of the extraction electrode system; a mass analyzing slit provided downstream of the mass analyzing electromagnet; a beam current measuring device provided downstream of the mass analyzing slit and configured to be retractably moved into the ion beam; a first electrode fixedly disposed immediately upstream of the beam current measuring device; an energy filter provided downstream of the beam current measuring device; a scanner provided downstream of the energy filter; and a collimator provided downstream of the scanner, wherein, in a state in which the beam current measuring device in the ion beam, the first electrode repels secondary electrons released from the beam current measuring device, back toward the beam current measuring device, and in a state in which the beam current measuring device is not in the ion beam, the first electrode is a beam optical element.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

In the ion beam irradiation apparatus according to various exemplary embodiments disclosed herein, a first electrode disposed in the beam transport channel and is configured to additionally serve as a suppressor electrode for the beam current measuring device. Thus, even if secondary electrons are released from a measuring part of the beam current measuring device as a result of irradiation of the measuring part with an ion beam, it becomes possible to repel the released secondary electrons toward the measuring part and thus prevent erroneous measurement due to the secondary electrons generated from the measuring part, without incorporating the suppressor electrode in the beam current measuring device itself.

Further, since no suppressor electrode is incorporated in the movable beam current measuring device itself, it becomes possible to simplify a drive mechanism for the movable beam current measuring device.

The ion beam irradiation apparatus may further comprise a mass analyzing slit disposed in the beam transport channel at a position upstream of the first electrode, and a second electrode disposed between the mass analyzing slit and the first electrode, and a potential of the first electrode may be lower than a potential of the second electrode.

The second electrode may determine an acceleration and/or a deceleration of an ion beam traveling toward a target disposed in a processing chamber, and the first electrode may suppress excessive convergence of the ion beam which would otherwise occur in the beam transport channel.

In some embodiments, the potential of the first electrode may be lower than the potential of the second electrode, irrespective of an acceleration and/or deceleration of an ion beam in the beam transport channel.

Various embodiments will now be described below.

Figure 1:
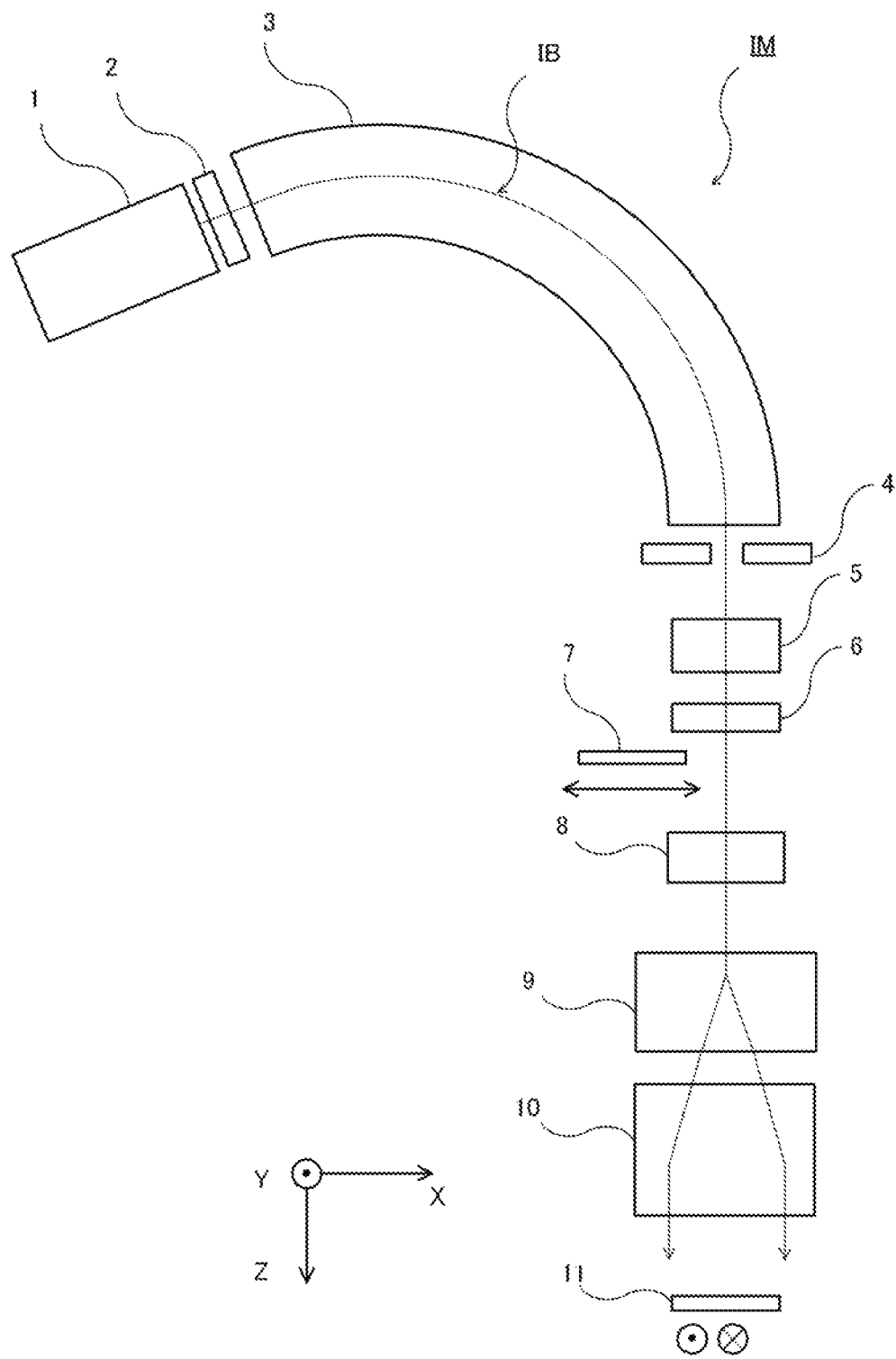
FIG. 1 is a schematic top plan view depicting an ion beam irradiation apparatus according to an embodiment.

FIG. 1 is a schematic top plan view depicting an ion beam irradiation apparatus IM according to an embodiment. Although the inventive concept will be described as being applied to the ion beam irradiation apparatus depicted in FIG. 1, this is only an example, and in other embodiments, the inventive concept may be applied to any type of apparatus having a beam transport channel for transporting an ion beam, such as, for example, an ion implantation apparatus, an ion beam etching apparatus, or an ion beam surface modifying apparatus.

In FIG. 1, X-axis, Y-axis and Z-axis directions (X, Y and Z-directions) are defined on the basis of an ion beam for irradiating a target 11. Specifically, the Z-direction is a traveling direction of the ion beam, and the X-direction is a scanning direction of the ion beam. The Y-direction is a direction orthogonal to both the X-direction and the Z-direction. Further, in FIG. 1, a beam trajectory IB of the ion beam indicates a central trajectory of ion species for irradiating the target 11. The configuration of the ion beam irradiation apparatus according to this embodiment will be described below, An ion beam is extracted from plasma generated in an ion source 1 by using an extraction electrode system 2 composed of a plurality of electrodes. Through a mass analyzing electromagnet 3 and a mass analyzing slit 4, specific ion species are analyzed (sorted) from a variety of ion species contained in the ion beam.

Subsequently, through a second electrode 5 fixedly disposed downstream of the mass analyzing slit 4, a first electrode 6 fixedly disposed downstream of the second electrode 5, and an energy filter 8 fixedly disposed downstream of the second electrode 5 in this order, the ion beam is adjusted to become a desired ion beam having final energy, with which the target 11 is to be irradiated. A method for the adjustment may be roughly classified into three types, according to setting of a potential of the second electrode 5.

The target 11 is typically provided at a ground potential. In a case in which the potential of the second electrode 5 is higher than the potential of the target 11, the ion beam is transported in a beam transport channel between the second electrode 5 and the target 11, while being accelerated on the whole (i.e., an acceleration mode). On the other hand, in a case in which the potential of the second electrode 5 is lower than the potential of the target 11, the ion beam is transported in the beam transport channel between the second electrode 5 and the target 11, while being decelerated on the whole (i.e., a deceleration mode). Further, in a case where the potential of the second electrode 5 is equal to the potential of the target 11, the ion beam is transported in the beam transport channel between the second electrode 5 and the target 11, without acceleration and deceleration, on the whole (i.e., a drift mode).

Selection of the above transport modes is determined by a type of ion species to be transported, and the level of final energy of the ion beam with which the target 11 is to be irradiated. The term "being accelerated on the whole" or "being decelerated on the whole" denotes that, although the ion beam is locally accelerated and decelerated, respectively, in the beam transport channel, the ion beam is accelerated or decelerated, respectively, when viewed as the entire beam transport channel.

If a potential difference between the potential of the second electrode 5 and the potential of the target 11 is excessively large, excessive convergence of the ion beam will occur during the course of beam transport in which the ion beam is transported while being accelerated or decelerated. A voltage is applied to the first electrode 6 so as to suppress such excessive convergence.

A beam current measuring device 7 is a measuring device configured to be selectively moved into and out of the beam trajectory IB (as shown by arrows in FIG. 1) at a position between the first electrode 6 and the energy filter 8, by a drive mechanism (not shown) and to measure a beam current of the ion beam when moved into the beam trajectory IB. Information measured by the beam current measuring device 7 is used to adjust a magnetic field in the mass analyzing electromagnet 3, such that a beam current of desired ion species is maximized. The movable beam current measuring device 7 is devoid of (i.e., provided separately from) a suppressor electrode for repelling secondary electrons generated from a measuring part (e.g., a Faraday cup body or an electroconductive flat plate) of the beam current measuring device 7, toward the measuring part.

The energy filter 8 has a function of deflecting the ion beam while locally accelerating or decelerating the ion beam. In FIG. 1, a deflection direction of the ion beam is assumed as the Y-direction. Through the energy filter 8, unnecessary energy components contained in the ion beam may be removed.

Subsequently, the ion beam is scanned in the X-direction by a scanner 9 disposed downstream of the energy filter 8, and the scanned ion beam (ion rays) is parallelized by a collimator 10 disposed downstream of the scanner 9. Here, the term "parallelized" denotes an operation of making uniform traveling directions of ion rays in the Z-direction. The parallelized ion beam irradiates the target 11 being reciprocatingly moved in the Y-direction by a drive mechanism (not shown). By the irradiation with the ion beam, the target 11 disposed in a processing chamber (not shown) may be subjected to ion implantation processing.

In the above described ion beam irradiation apparatus IM, a voltage is applied to the first electrode 6, such that a potential of the first electrode 6 becomes lower than a potential of the beam current measuring device 7. The voltage difference makes it possible to repel secondary electrons generated from the measuring part of the beam current measuring device 7, toward to the measuring part, by using the first electrode 6 fixedly disposed in the beam transport channel, without incorporating a suppressor electrode in the beam current measuring device 7. Further, since no suppressor electrode is incorporated in the movable beam current measuring device 7, it becomes possible to simplify the drive mechanism for driving the beam current measuring device 7.

Figure 2:
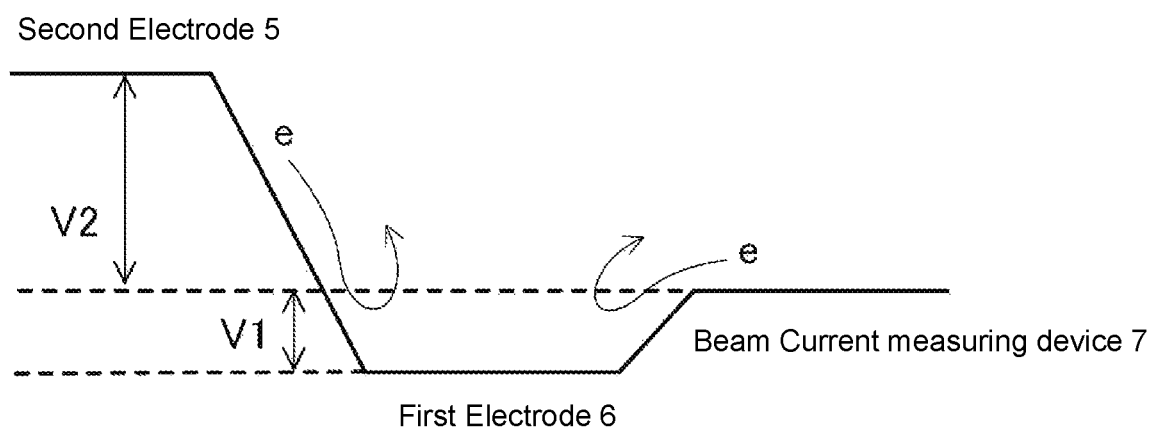
FIG. 2 is an explanatory diagram depicting an example of a potential relationship during an acceleration mode.
Figure 3:
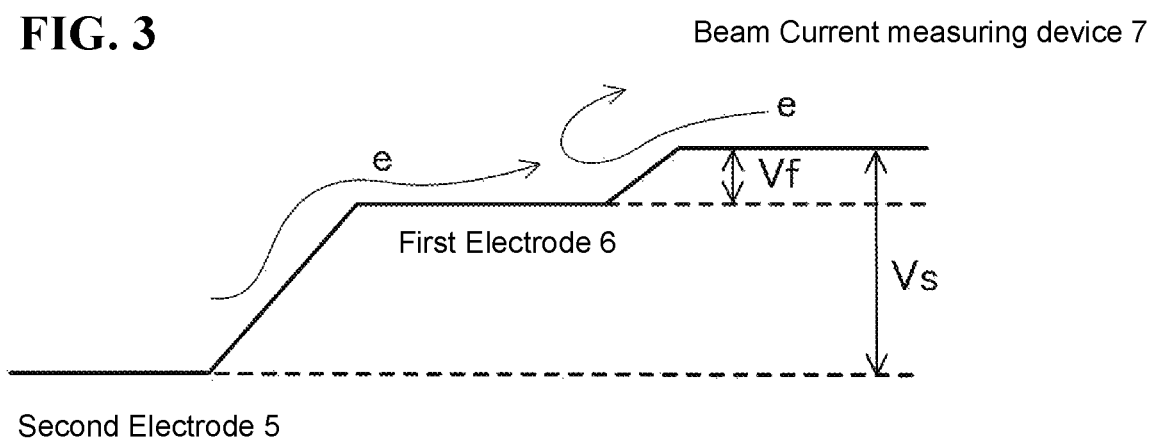
FIG. 3 is an explanatory diagram depicting an example of a potential relationship during a deceleration mode.
Figure 4:
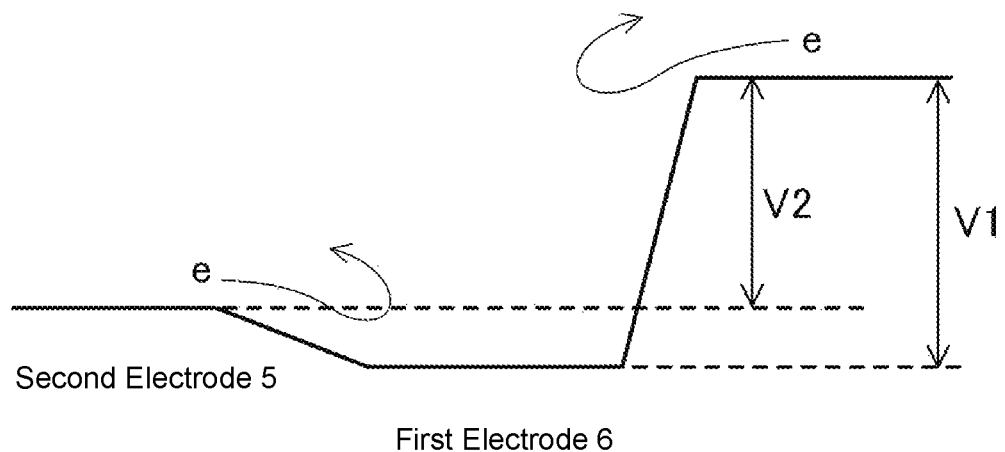
FIG. 4 is an explanatory diagram depicting another example of a potential relationship during the deceleration mode.
Figure 5:
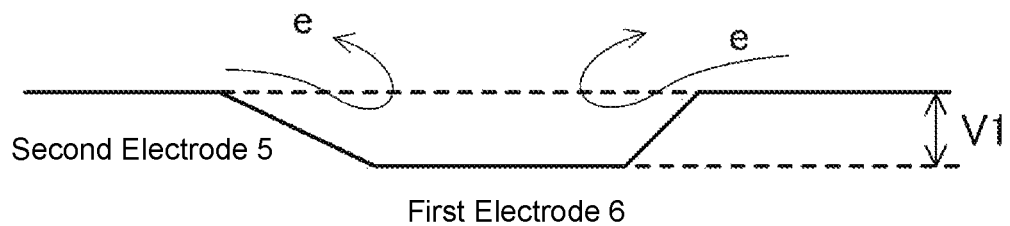
FIG. 5 is an explanatory diagram depicting an example of a potential relationship during a drift mode.

With reference to FIGS. 2 to 5, a potential relationship among the second electrode 5, the first electrode 6, and the beam current measuring device 7 during each of the acceleration, deceleration and drift modes will be described below. In each of FIGS. 2 to 5, the vertical direction represents the magnitude of a potential, and a rightward direction corresponds to a direction along which the ion beam is transported. In FIGS. 2, 4 and 5, the reference sign V1 denotes a potential difference between the beam current measuring device and the first electrode, and the reference sign V2 denotes a potential difference between the beam current measuring device and the second electrode. The potential of the beam current measuring device 7 and the target 11 are each set to the ground potential.

FIG. 2 is an explanatory diagram depicting an example of a potential relationship during an acceleration mode.

The potential of the first electrode 6 is lower than the potential of the beam current measuring device 7 (i.e., a potential difference V1), so that secondary electrons released from the measuring part of the beam current measuring device 7 are repelled back toward the beam current measuring device 7, as seen in the behavior of a secondary electron e depicted on the right side in FIG. 2.

A secondary electron e depicted on the left side in FIG. 2 is a secondary electron generated when the ion beam collides with the second electrode 5, or a wall surface of the beam transport channel between the second electrode 5 and the first electrode 6.

In the voltage potential setting in FIG. 2, the potential of the first electrode 6 is lower than the potential of the second electrode 5 (i.e., a potential difference V1+V2), so that the secondary electron e depicted on the left side in FIG. 2 is also repelled back toward the second electrode 5. However, in some voltage potential settings of the potentials of the first electrode 6 and the second electrode 5, there is a possibility that secondary electrons e (not shown) generated on an upstream side of the first electrode 6 flow into the measuring part of the beam current measuring device 7.

FIG. 3 is an explanatory diagram depicting an example of a potential relationship during a deceleration mode.

In FIG. 3, the potential of the first electrode 6 is lower than the potential of the beam current measuring device 7 (i.e., a potential difference Vf), similar to the example shown in FIG. 2. A secondary electron e depicted on the right side of FIG. 3 is repelled back toward the measuring part of the beam current measuring device 7, in the same manner as that in the acceleration mode.

On the other hand, in the voltage potential setting in FIG. 3, the potential of the first electrode 6 is higher than the potential of the second electrode 5, so that a secondary electron e depicted on the left side of FIG. 3 is drawn toward the first electrode 6, and finally flows into the beam current measuring device 7. As a result, an error in beam current measurement occurs.

The setting in FIG. 4 is intended to address the above problem.

As depicted in FIG. 4, the potential of the first electrode 6 is set lower than the potentials of the second electrode 5 and the beam current measuring device 7. That is, the potential difference between the beam current measuring device 7 and the second electrode is V2 as shown in FIG. 4, and the potential difference between the beam current measuring device 7 and the first electrode is V1, where V1>V2. Thus, it becomes possible to repel secondary electrons flowing into the first electrode 6 from the upstream side (i.e., from the second electrode 5 side) and from the downstream side (i.e., from the beam current measuring device 7 side) thereof in the beam transport channel, respectively, toward the upstream and downstream sides, respectively.

FIG. 5 is an explanatory diagram depicting an example of a potential relationship during a drift mode.

In the voltage potential setting in FIG. 5, the potential of the first electrode 6 is set lower than the potentials of the second electrode 5 and the beam current measuring device 7, as with the setting in FIG. 4. However, in FIG. 5, the potential of the second electrode 5 and the potential of the beam current measuring device 7 are set to substantially the same potential. That is, the potential different between the second electrode 5 and the first electrode 6 is V1, and the potential difference between the beam current measuring device 7 and the first electrode 6 is also V1. Thus, it becomes possible to repel back secondary electrons flowing into the first electrode 6 from the upstream side (i.e., from the second electrode 5 side) and the downstream side (i.e., from the beam current measuring device 7 side) thereof in the beam transport channel, respectively, toward the upstream and downstream sides, respectively.

As noted earlier, although the above embodiments have been described based on an example in which the present inventive concept is applied to an ion implantation apparatus, this is only an example, and the present inventive concept may be applied to any type of apparatus for handling an ion beam as long as the apparatus comprises a movable beam current measuring device in a beam transport channel.

In the above embodiments, the first electrode 6 is configured to suppress excessive convergence. However, the function of the first electrode 6 is not limited thereto. For example, among a group of electrodes making up an Einzel lens disposed in a beam transport channel to converge an ion beam, the downstream most electrode may be additionally used as a suppressor electrode for the beam current measuring device 7.

Although the above embodiments have been described based on an example in which the ion beam irradiation apparatus comprises the second electrode 5 for selecting the ion beam transport mode in the beam transport channel, in some embodiments the second electrode 5 may be omitted depending of a type of ion beam irradiation apparatus. For example, in an ion beam irradiation apparatus devoid of the second electrode 5, it is conceivable that, during extraction of an ion beam, energy of the extracted ion beam is set to final energy.

Due to a collision of an ion beam with the first electrode 6, secondary electrons are released from the first electrode 6, and are likely to flow into the measuring part of the beam current measuring device 7. Considering this possibility, the first electrode 6 is advantageously configured to avoid collision with an ion beam.

In the above embodiments, examples of the first electrode 6 include an electrode for suppressing excessive convergence, and a part of a plurality of electrodes making up Einzel lens. However, as may be understood from the fact that such an excessive convergence-suppressing electrode or Einzel lens can be omitted depending on a type of ion beam irradiation apparatus, the above configurations of the first electrode 6 are simply shown as examples.

A configuration and function of the first electrode are as follows.

The first electrode may be configured to serve both as a suppressor electrode for repelling secondary electrons released from the beam current measuring device, back toward the beam current measuring device, and as a beam optical element other than the suppressor electrode, disposed in the beam transport channel.

In a state in which the beam current measuring device is disposed outside (i.e., retracted out of) the beam trajectory, the first electrode does not serve as the suppressor electrode, but serves as a beam optical element other than the suppressor electrode.

Further, the first electrode may make up at least a part of a beam optical element, wherein the beam optical element is an optical element composed of an electrode to be used for controlling a shape, energy or the like of an ion beam passing therethrough.

In regard to the voltage to be applied to the first electrode 6, the first electrode 6 is advantageously configured such that a constant voltage is applied to the first electrode 6 such that the first electrode 6 may normally serve as a beam optical element other than the suppressor electrode, and, immediately after moving the beam current measuring device 7 into the beam trajectory, serve as the suppressor electrode. In some embodiments, the voltage applied to the first electrode 6 may be a negative voltage. A negative voltage may be applied because it is often the case that the potential of the beam current measuring device is set to the ground potential.

Although the above embodiments have been described based on an example in which the magnetic field in the analyzing electromagnet is adjusted based on a measurement result obtained in the beam current measuring device 7, the intended purpose of the beam current measuring device 7 is not necessarily limited thereto. Any other suitable type of beam current measuring device may be used, as long as the beam current measuring device is capable of being retractably moved into the beam trajectory in the beam transport channel.

Although the above embodiments have been described based on an example in which the ion beam is scanned by a scanner 9 and collimated by a collimator 10, the ion beam irradiation apparatus IM may omit the scanner 9 and the collimator 10 in some embodiments. In this case, the ion beam may be, for example, a ribbon beam in the X direction or Y direction.

It should be understood that the present inventive concept is not limited to the above described embodiments, but various changes and modifications may be made therein without departing from the spirit and scope thereof as set forth in appended claims.

What is claimed is:

1. An apparatus comprising:
a beam current measuring device configured to be retractably moved into an ion beam trajectory so as to measure an ion beam current;
a first electrode disposed immediately upstream of the beam current measuring device in an ion beam transport channel, the first electrode being configured to serve both as a suppressor electrode for repelling secondary electrons released from the beam current measuring device, back toward the beam current measuring device while measuring the ion beam current, and as a beam optical element other than the suppressor electrode that controls the ion beam passing therethrough;
a second electrode disposed immediately upstream of the first electrode in the ion beam transport channel; and
an energy filter disposed downstream of the first electrode,
wherein a voltage difference between a second voltage potential of the second electrode and a voltage potential of a target disposed in a processing chamber determines an acceleration and deceleration of the ion beam traveling in the ion beam transport channel toward a target position of the target, and
a first voltage potential of the first electrode suppresses excessive convergence of the ion beam which would otherwise occur in the ion beam transport channel.

2. The apparatus as recited in claim 1, further comprising:
a mass analyzing slit disposed in the ion beam transport channel at a position upstream of the first electrode;
wherein the second electrode is disposed between the mass analyzing slit and the first electrode,
wherein the first voltage potential is lower than the second voltage potential of the second electrode.

3. The apparatus as recited in claim 1, wherein the first voltage potential is always lower than the second voltage potential, irrespective of acceleration and deceleration of the ion beam in the ion beam transport channel.

4. The apparatus as recited in claim 1, wherein the beam current measuring device comprises a plurality of Faraday cups.

5. The apparatus recited in claim 1, wherein a first voltage is applied to the first electrode while the first electrode serves as a suppressor electrode, and a second voltage, different from the first voltage, is applied to the first electrode while the first electrode serves as the beam optical element.

6. An apparatus comprising:
a beam current measuring device configured to be retractably moved into an ion beam trajectory in an ion beam transport channel;
a first electrode fixedly disposed immediately upstream of the beam current measuring device in the ion beam transport channel;
a second electrode disposed immediately upstream of the first electrode in the ion beam transport channel; and
an energy filter disposed downstream of the first electrode,
wherein, in a state in which the beam current measuring device in the ion beam trajectory, the first electrode repels secondary electrons released from the beam current measuring device, back toward the beam current measuring device,
in a state in which the beam current measuring device is not in the ion beam trajectory, the first electrode is a beam optical element that controls the ion beam passing therethrough,
a voltage difference between a second voltage potential of the second electrode and a voltage potential of a target disposed in a processing chamber determines an acceleration and deceleration of the ion beam traveling in the ion beam transport channel toward a target position of the target, and
a first voltage potential of the first electrode suppresses excessive convergence of the ion beam which would otherwise occur in the ion beam transport channel.

7. The apparatus as recited in claim 6, wherein the second electrode is fixedly disposed immediately upstream of the first electrode in the ion beam transport channel.

8. The apparatus as recited in claim 7, wherein the first voltage potential is lower than the second voltage potential.

9. The apparatus as recited in claim 8, wherein a potential of the beam current measuring device is greater than the second voltage potential.

10. The apparatus as recited in claim 8, wherein a potential of the beam current measuring device is equal to the second voltage potential.

11. The apparatus as claimed in claim 8, wherein a potential of the beam current measuring device is greater than the first voltage potential and less than the second voltage potential.

12. The apparatus as recited in claim 6, wherein the beam current measuring device comprises a plurality of Faraday cups.

13. An ion beam irradiation apparatus for irradiating a target with an ion beam, the apparatus comprising:
an ion source;
an extraction electrode system that extracts ions from the ion source;
a mass analyzing electromagnet provided downstream of the extraction electrode system;
a mass analyzing slit provided downstream of the mass analyzing electromagnet;
a beam current measuring device provided downstream of the mass analyzing slit and configured to be retractably moved into the ion beam;
a first electrode fixedly disposed immediately upstream of the beam current measuring device;
a second electrode disposed immediately upstream of the first electrode in the ion beam transport channel; and
an energy filter provided downstream of the first electrode,
wherein, in a state in which the beam current measuring device in the ion beam, the first electrode repels secondary electrons released from the beam current measuring device, back toward the beam current measuring device,
in a state in which the beam current measuring device is not in the ion beam, the first electrode is a beam optical element that controls the ion beam passing therethrough,
a voltage difference between a second voltage potential of the second electrode and a voltage potential of a target disposed in a processing chamber determines an acceleration and deceleration of the ion beam traveling in the ion beam transport channel toward a target position of the target, and
a first voltage potential of the first electrode suppresses excessive convergence of the ion beam which would otherwise occur in the ion beam transport channel.

14. The ion beam irradiation apparatus as recited in claim 13, further comprising:
a scanner provided downstream of the energy filter; and
a collimator provided downstream of the scanner.

15. The ion beam irradiation apparatus as recited in claim 13, wherein the second electrode is fixedly disposed between the first electrode and the analyzing slit.

16. The ion beam irradiation apparatus as recited in claim 15, wherein the first voltage potential is lower than the second voltage potential.

17. The ion beam irradiation apparatus as recited in claim 16, wherein a potential of the beam current measuring device is greater than the second voltage potential.

18. The ion beam irradiation apparatus as recited in claim 16, wherein a potential of the beam current measuring device is equal to the second voltage potential.

19. The ion beam irradiation apparatus as claimed in claim 16, wherein a potential of the beam current measuring device is greater than the first voltage potential and less than the second voltage potential.

\* \* \* \* \*